United States Patent
Im et al.

(10) Patent No.: US 7,616,518 B2
(45) Date of Patent: Nov. 10, 2009

(54) MULTI-PORT MEMORY DEVICE WITH SERIAL INPUT/OUTPUT INTERFACE

(75) Inventors: Jae-Hyuk Im, Kyoungki-do (KR); Chang-Ho Do, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 213 days.

(21) Appl. No.: 11/528,970

(22) Filed: Sep. 27, 2006

(65) Prior Publication Data

US 2007/0073981 A1    Mar. 29, 2007

(30) Foreign Application Priority Data

Sep. 29, 2005   (KR)   ............ 10-2005-0090936
Apr. 11, 2006   (KR)   ............ 10-2006-0032948

(51) Int. Cl.
*G11C 8/00* (2006.01)

(52) U.S. Cl. ............ 365/230.05; 365/230.03; 365/220; 365/221; 365/219

(58) Field of Classification Search ............ 365/230.05, 365/219, 220, 221, 230.03
See application file for complete search history.

(56) References Cited

U.S. PATENT DOCUMENTS

| | | | |
|---|---|---|---|
| 5,742,557 A | 4/1998 | Gibbins et al. | |
| 5,796,745 A | 8/1998 | Adams et al. | |
| 5,896,330 A | 4/1999 | Gibson | |
| 6,067,595 A * | 5/2000 | Lindenstruth | ............ 710/307 |
| 6,122,218 A | 9/2000 | Kang | |
| 6,288,969 B1 | 9/2001 | Gibbins et al. | |
| 6,594,196 B2 | 7/2003 | Hsu et al. | |
| 6,714,477 B2 * | 3/2004 | Nakayama et al. | ...... 365/230.03 |
| 6,845,429 B2 | 1/2005 | Mattausch et al. | |
| 7,120,081 B2 * | 10/2006 | Lee | ............ 365/230.05 |
| 2002/0146025 A1 | 10/2002 | Okina | |
| 2004/0246807 A1 | 12/2004 | Lee | |
| 2005/0249018 A1 | 11/2005 | Lee et al. | |
| 2005/0251713 A1 | 11/2005 | Lee | |
| 2007/0070778 A1 | 3/2007 | Do | |

FOREIGN PATENT DOCUMENTS

JP    2002-230977    8/2002

* cited by examiner

*Primary Examiner*—Huan Hoang
*Assistant Examiner*—Kretelia Graham
(74) *Attorney, Agent, or Firm*—Blakely Sokoloff Taylor & Zafman

(57) ABSTRACT

A multi-port memory device includes a plurality of ports located at a center region of the multi-port memory device, each for performing a data communication with a corresponding external device; a plurality of banks arranged at upper and lower regions of the multi-port memory device in a row direction on the basis of the plurality of ports; and first and second global I/O data buses arranged in the row direction between the banks and the ports, each for independently performing a data transmission between the banks and the ports.

43 Claims, 12 Drawing Sheets

MULTI-PORT MEMORY DEVICE WITH SERIAL INPUT/OUTPUT INTERFACE

FIELD OF THE INVENTION

The present invention relates to a semiconductor memory device; and, more particularly, to a multi-port memory device with a serial input/output (I/O) interface for processing a multiple concurrent operation with external devices.

DESCRIPTION OF RELATED ARTS

Generally, most memory devices including random access memory (RAM) have a single port with a plurality of input/output pin sets. That is, the single port is provided for data exchange between a memory device and an external chipset. Such a memory device having the single port uses a parallel input/output (I/O) interface to simultaneously transmit multi-bit data through signal lines connected to a plurality of input/output (I/O) pins. The memory device exchanges data with the external device through a plurality of I/O pins in parallel.

The I/O interface is an electrical and mechanical scheme to connect unit devices having different functions through signal lines and transmit transmission/reception data precisely. An I/O interface, described below, must have the same precision. The signal line is a bus to transmit an address signal, a data signal, and a control signal. A signal line, described below, will be referred as a bus.

The parallel I/O interface has high data processing efficiency (speed) because it can simultaneously transmit multi-bit data through a plurality of buses. Therefore, the parallel I/O interface is widely used in a short distance transmission that requires a high speed. In the parallel I/O interface, however, the number of buses for transmitting I/O data increases. Consequently, as distance increases, the manufacturing cost increases. Due to the limitation of the single port, a plurality of memory devices is independently configured so as to support various multi-media functions in terms of hardware of a multi-media system. While an operation for a certain function is carried out, an operation for another function cannot be concurrently carried out.

Considering the disadvantage of the parallel I/O interface, many attempts to change the parallel I/O interface into serial I/O interface have been made. Also, considering compatible expansion with devices having other serial I/O interfaces, the change to serial I/O interface in an I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

A conventional multi-port memory device having a serial I/O interface includes a processor for processing serial I/O signals, and a DRAM core for performing a parallel low-speed operation. The processor and the DRAM core are implemented on the same wafer, that is, a single chip.

FIG. 1 is a block diagram of a conventional single port memory device. For convenience of explanation, a conventional x16 512M DRAM device as the single port memory device is illustrated.

The x16 512M DRAM device includes a plurality of memory cells, first to fourth banks BANK0 to BANK3, a single port PORT, and a plurality of global input/output (I/O) data buses GIO. The plurality of memory cells is arranged with a plurality of N×M memory cells having a matrix form, M and N being positive integers. The first to fourth banks BANK0 to BANK3 includes a row/column decoder for selecting a specific memory cell by row and column lines. The single port PORT controls signals inputted from or outputted to the first to fourth banks BANK0 to BANK3. The global I/O data buses GIO transfers signals between the single port and the banks, and between the single port and input/output (I/O) pins. Referring to FIG. 1, the global I/O data buses GIO include a control bus, fifteen address buses and sixteen data buses.

As described above, the single port memory device includes only a single port with a plurality of I/O pin sets for transferring data signals between the single port memory device and external devices via an external chipset.

A process for transferring signals from the banks to the external devices is described. The signals outputted from the first to fourth banks BANK0 to BANK3 through the sixteen data buses are transferred to the external devices in parallel through the external chipset by way of the single port PORT.

A process for transferring signals from the external devices to the banks is described. The signals outputted from the external devices in parallel through the external chipset are transferred to the single port PORT, and then are transferred to the first to fourth banks BANK0 to BANK3 through the sixteen data buses. The transferred signals are transferred to the memory cells under the control of a control unit provided within the banks, e.g., a decoder and a driver.

Meanwhile, the signals transferred to the external devices from the first to fourth banks BANK0 to BANK3 include an address and a command as well as data signals. The address and command are transferred to the single port PORT from the external devices in parallel via extra input/output address and command pins except for the sixteen data buses. The command transferred to the single port PORT is inputted to the banks through the single control bus, and the address transferred to the single port PORT is inputted to the banks through the fifteen address buses.

However, in the single port memory device, it is difficult for implement various multimedia functions because the single port memory device uses only one port. To implement the various multimedia functions in the single port memory device, each DRAM device has to be constituted independent of each other so as to perform its unique function. When the DRAM devices are constituted independent of each other, it is difficult to allocate a proper memory amount between memory devices based on the number of access times. As a result, an efficiency of utilization to density of the whole memory device is decreased.

SUMMARY OF THE INVENTION

It is, therefore, an object of the present invention to provide a multi-port memory device capable of performing a multiple concurrent operation with external devices having an application for an independent data processing.

In accordance with an aspect of the present invention, there is provided a multi-port memory device including: a plurality of ports located at a center region of the multi-port memory device, each for performing a data communication with a corresponding external device; a plurality of banks arranged at upper and lower regions of the multi-port memory device in a row direction on the basis of the plurality of ports; and first and second global I/O data buses arranged in the row direction between the banks and the ports, each for independently performing a data transmission between the banks and the ports.

In accordance with further aspect of the present invention, there is provided a multi-port memory device including: a plurality of ports located at a center region of the multi-port memory device, each for performing a serial data communication with a corresponding external device; a plurality of banks, arranged at upper and lower regions of the multi-port memory device in a row direction on the basis of the plurality of ports, for performing a parallel data communication with the plurality of ports; and a plurality of bank control units, each bank control unit allocated to a corresponding one of the banks and controlling the data transmission between the corresponding bank and the ports.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a multi-port memory device with a serial input/output (I/O) interface in accordance with exemplary embodiments of the present invention will be described in detail with reference to the accompanying drawings.

Figure 1:
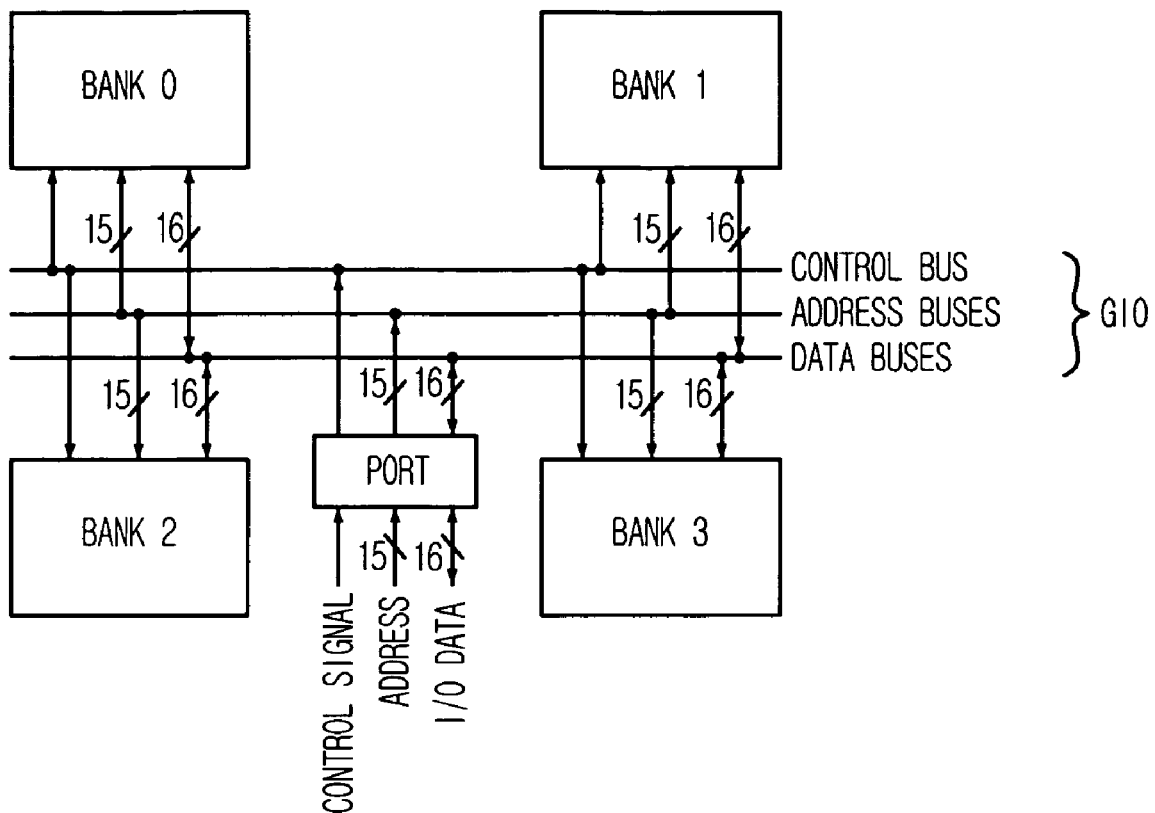
FIG. 1 is a block diagram of a conventional single-port memory device.
Figure 2:
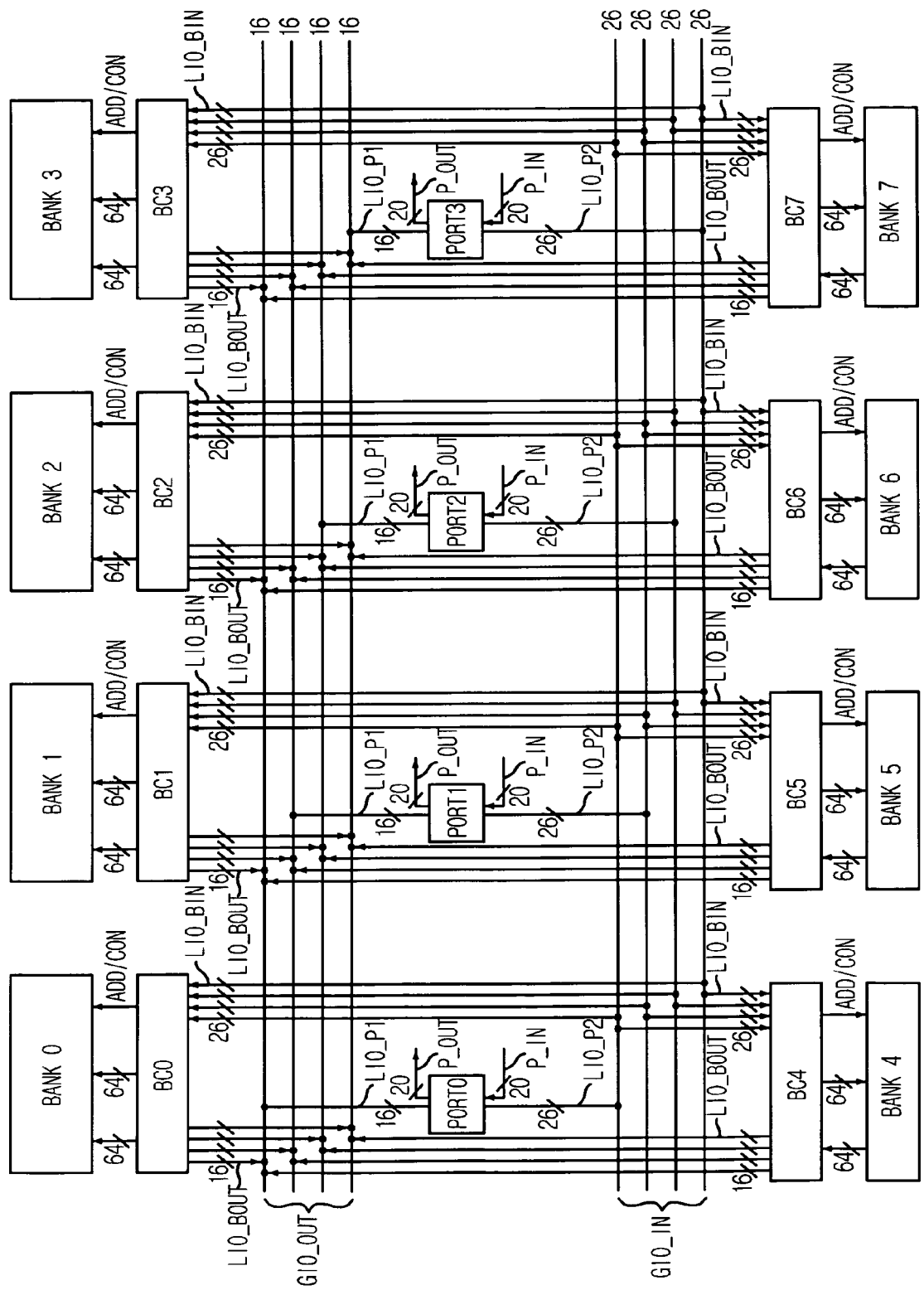
FIG. 2 is a block diagram of a multi-port memory device in accordance with an embodiment of the present invention.

FIG. 2 is a block diagram of a multi-port memory device in accordance with an embodiment of the present invention. For convenience of explanation, the multi-port memory device having four ports and eight banks is illustrated. Particularly, it is assumed that the multi-port memory device has a 16-bit data frame and performs a 64-bit prefetch operation.

The multi-port memory device includes first to fourth ports PORT0 and PORT3, first to eighth banks BANK0 to BANK7, first and second global input/output (I/O) data buses GIO_OUT and GIO_IN, and first to eighth bank control units BC0 to BC7.

Each of the first to fourth ports PORT0 and PORT3 located at a center of the multi-port memory device is arranged in a row direction, and performs a serial data communication with its own external device independent of each other. The first to eighth banks BANK0 to BANK7 are divided into upper banks BANK0 to BANK3 and lower banks BANK4 to BANK7 based on the first to fourth ports PORT0 to PORT3 and arranged in the row direction.

The first global I/O bus GIO_OUT is arranged in the row direction between the upper banks BANK0 to BANK3 and the first to fourth ports PORT0 to PORT3, and transmits output data in parallel. The second global I/O bus GIO_IN is arranged in the row direction between the lower banks BANK4 to BANK7 and the first to fourth ports PORT0 to PORT3, and transmits input data in parallel.

The first to eighth bank control units BC0 to BC7 control a signal transmission between the first and second global I/O buses GIO_OUT and GIO_IN and the first to eighth banks BANK0 to BANK7.

Figure 3:
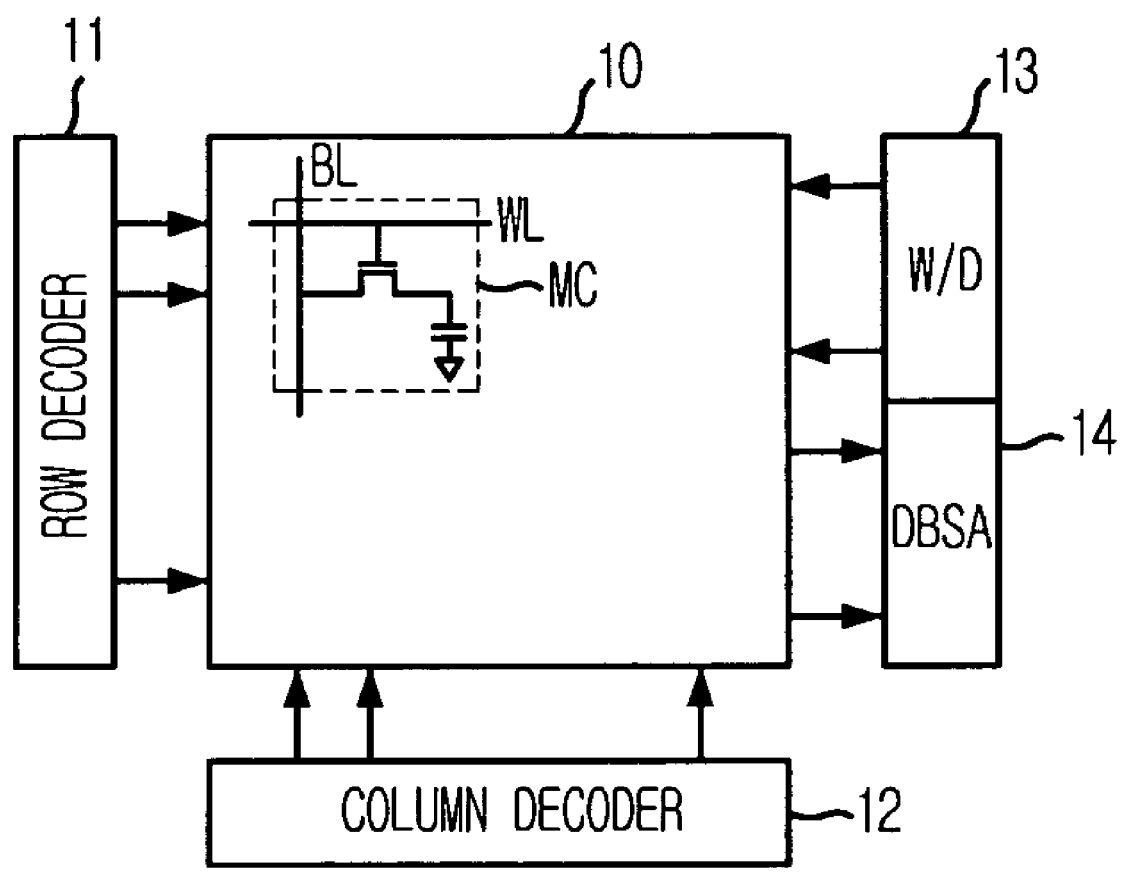
FIG. 3 is a detailed block diagram of a first bank illustrated in FIG. 2.

FIG. 3 is a detailed block diagram of the first bank BANK0 illustrated in FIG. 2. The other banks BANK1 to BANK7 have the same structure with that of the first bank BANK0.

The first bank BANK0 includes a memory cell array 10, row & column decoders 11 and 12, a write driver (W/D) 13, a data bus sense amplifier (DBSA) 14, and an equalizer (not shown).

The memory cell array 10 includes a plurality of memory cells MCs arranged with an N by M matrix form, M and N being positive integers. Each of the row & column decoders 11 and 12 selects one of the memory cells MCs by a row and a column.

The first to eighth banks BANK0 to BANK7 having such a constitution divide the multi-port memory device by half based on the first to fourth ports PORT0 to PORT3 so that the upper banks BANK0 to BANK3 and the lower banks BANK4 to BANK7 are symmetrically located at the row direction.

Figure 4:
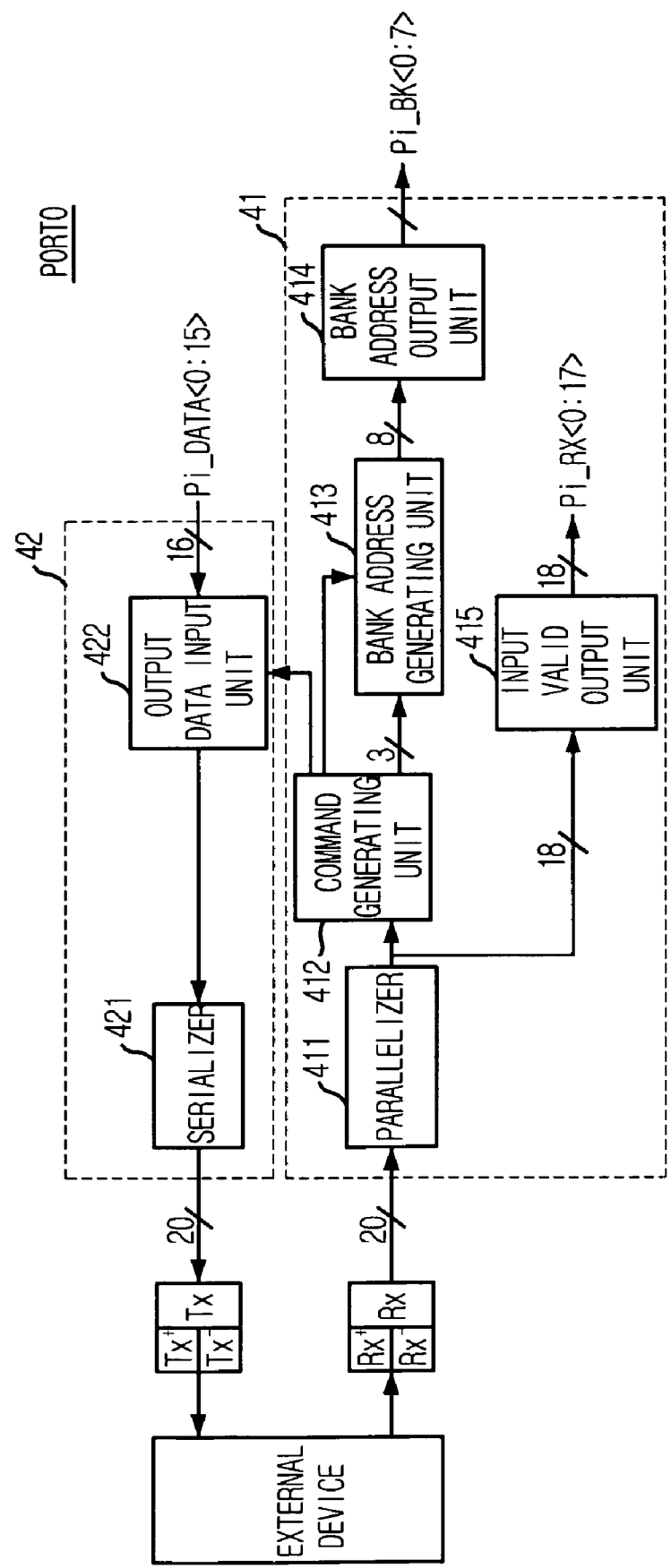
FIG. 4 is a detailed block diagram of a first port illustrated in FIG. 2.

FIG. 4 is a circuit diagram of the first port PORT0 illustrated in FIG. 2. Each port PORT0 to PORT3 located at the center of the multi-port memory device is connected to the first and second global I/O data buses GIO_OUT and GIO_IN so as to independently access all banks. The other ports PORT1 to PORT3 have the same structure with that of the first port PORT0, and thus, the first port PORT0 is explained as an example.

Referring to FIG. 4, the first port PORT0 includes a reception unit 41 and a transmission unit 42. The reception unit 41 receives signals inputted from the external devices (Hereinafter, referring to "input signals") through a reception pad RX, and the transmission unit 42 outputs signals outputted from the first to eighth banks (Hereinafter, referring to "output signals") through a transmission pad TX. The reception unit 41 and the transmission unit 42 operate independently so that the input signals and the output signals are simultaneously transferred.

In detail, the reception unit 41 deserializes 20-bit input signals, which are inputted from the external devices through the reception pad RX in series, to convert and output the deserialized input signals as 26-bit valid signals effective for an operation of the DRAM device. Herein, the 26-bit valid signals include an 8-bit port/bank selection signal group P0_BK<0:7>, and an 18-bit input valid data signal group P0_RX<0:17>. The 18-bit input valid data signal group P0_RX<0:17> includes a command flag signal, a row address strobe/data mask (RAS/DM) signal, and 16-bit command/address/data signals. Herein, the 16-bit command/address/data signals may be addresses, commands or data signals.

Figure 5A:
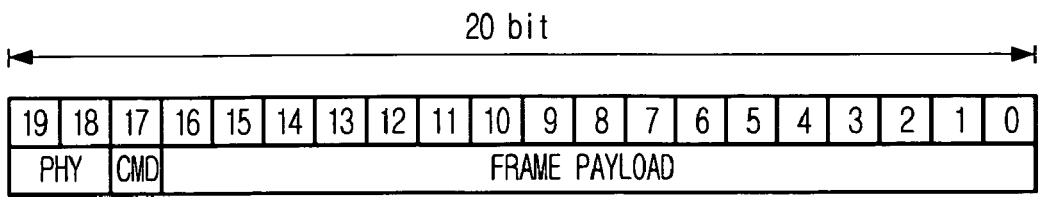
FIGS. 5A to 5F are a frame form of input signals input to the first port shown in FIG. 4.
Figure 5B:
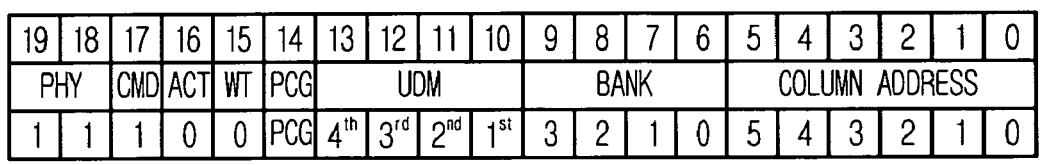
Figure 5C:
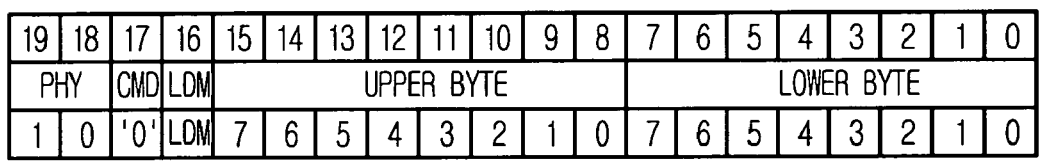
Figure 5D:
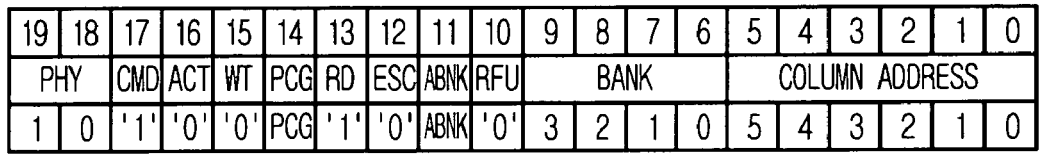
Figure 5E:
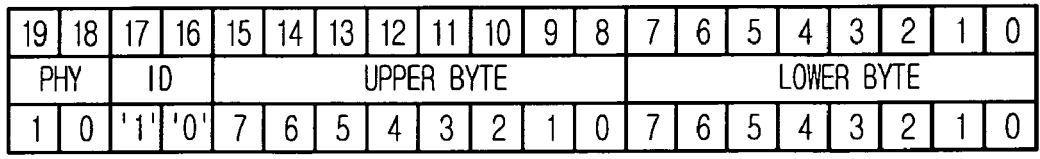
Figure 5F:
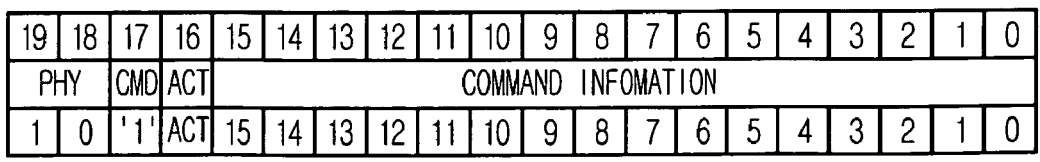

FIGS. 5A to 5F are a frame form of the input signals input to the first port shown in FIG. 4. FIG. 5A is a basic frame form, FIG. 5B is a write command frame form, FIG. 5C is a write data frame form, FIG. 5D is a read command frame form, FIG. 5E is a read data frame form, and FIG. 5F is a command frame form.

As an example, the write command frame and the write data frame shown in FIGS. 5B and 5C are described in detail.

Referring to FIG. 5B, the write command frame is a unit of 20-bit serialized signals inputted from the external devices. $18^{th}$ and $19^{th}$ bits PHY among the 20-bit serialized signals correspond to a physical link coding bit, a $17^{th}$ bit CMD means a command start point, a $16^{th}$ bit ACr means an internal active state, a $15^{th}$ bit WT corresponds to an internal write command, and a $14^{th}$ bit PCG means an internal inactive state. For example, during a normal write operation, $17^{th}$ to $14^{th}$ bits become "1010." During an auto-precharge write operation, $17^{th}$ to $14^{th}$ bits become "1011." $13^{th}$ to $10^{th}$ bits UDM are used as an upper-byte write data mask signal of write data applied over four clocks, $9^{th}$ to $6^{th}$ bits BANK mean bank data written during a write operation, and the $5^{th}$ to $0^{th}$ bits COLUMN ADDRESS mean a column address.

Referring to FIG. 5C, the write data frame is 16-bit write data applied over four clocks after the write command frame shown in FIG. 5B are inputted. Herein, a $17^{th}$ bit CMD becomes a logic level "LOW", a $16^{th}$ bit LDM are used as a lower-byte write data mask signal of the write data, and each of $15^{th}$ to $8^{th}$ bits UPPER BYTE and $7^{th}$ to $0^{th}$ bits LOWER BYTE means an upper byte and a lower byte of the write data, respectively.

Referring to FIGS. 4 to 5F, detailed constitutions of the reception unit 41 and the transmission unit 42 are described.

The reception unit 41 includes a parallelizer 411, a command generating unit 412, a bank address generating unit 413, a bank address output unit 414, and an input valid data output unit 415.

The parallelizer 411 deserializes the 20-bit input signals (one frame) inputted from the external devices through the reception pad RX in series and outputs the deserialized input signals as 20-bit parallel signals.

The command generating unit 412 determines an operation of the 20-bit parallel signals by using the $17^{th}$ bit CMD of the 20-bit parallel signals outputted from the parallelizer 411. That is, if the $17^{th}$ bit CMD of the write command frame shown in FIG. 5B is a logic level "LOW", the command generating unit 412 determines the 20-bit parallel signals performs a write operation; and if the $17^{th}$ bit CMD is a logic level "HIGH", the command generating unit 412 determines the 20-bit parallel signals performs a read operation. Further, the command generating unit 412 outputs a bank information bit utilized as bank data of the 20-bit parallel signals. Herein, the number of the bank information bit is three because the number of banks is eight, and this bit is included in a frame payload shown in FIG. 5A.

The bank address generating unit 413 outputs 8-bit bank addresses for selecting a corresponding bank of the first to eighth banks BANK0 to BANK7 based on the 3-bit bank information bit. The bank address generating unit 413 may include a 3 by 8 decoder which outputs 8-bit output signals by receiving 3-bit input signals.

The bank address output unit 414 outputs the 8-bit port/bank selection signal group P0_BK<0:7> to the second global I/O data bus GIO_IN based on the 8-bit bank addresses inputted from the bank address generating unit 413. The bank address output unit 414 may include a plurality of output drivers.

The input valid data output unit 415 outputs the 18-bit input valid data signal group P0_RX<0:17> to the second global I/O data bus GIO_IN based on output signals from the parallelizer 411. The input valid data output unit 415 may include a plurality of output drivers.

The transmission unit 42 receives and serializes as an output a valid data signal group P0_DATA<0:15> inputted from the banks through the first global data bus GIO_OUT in parallel to output the serialized signals to the transmission pad TX.

In detail, the transmission unit 42 includes a serializer 421 and an output valid data input unit 422.

The output valid data input unit 422 receives the 16-bit output valid data signal group P0_DATA<0:15> inputted from the banks through the first global data bus GIO_OUT, and packets them fit for a transfer protocol under the control of the command generating unit 412, i.e., according to the read or write operation. As a result, 20-bit frame output signals are outputted. The output valid data input unit 422 may include a plurality of input drivers.

The serializer 421 serializes the 20-bit frame output signals inputted from the output valid data input unit 422 in parallel, and outputs the serialized signals to the transmission pad TX in series.

Meanwhile, the first global I/O data bus GIO_OUT includes 64-bit buses, i.e., 16 (the number of data bits) by 4 (the number of ports), for transferring the output valid data signal group Pi_DATA<0:15> inputted from the banks to each port independently. The second global I/O data bus GIO_IN includes 104-bit buses, i.e., 26 (the number of data bits) by 4 (the number of ports), for transferring the input valid data signal group Pi_RX<0:17> and the port/bank selection signal group Pi_BK<0:7> inputted from the ports to each bank independently. Herein, the "i" corresponds to the number of ports as an integer from 0 to 3.

The first and second global I/O data buses GIO_OUT and GIO_IN are connected to a plurality of local data buses for transferring signals with each bank control unit or each port. The local data buses connect the first and second global I/O data buses GIO_OUT and GIO_IN to the first to eighth bank control units BC0 to BC7 or the first to fourth ports PORT0 to PORT3. For convenience of explanation, the local data buses are classified into first to fourth local data buses.

Figure 6:
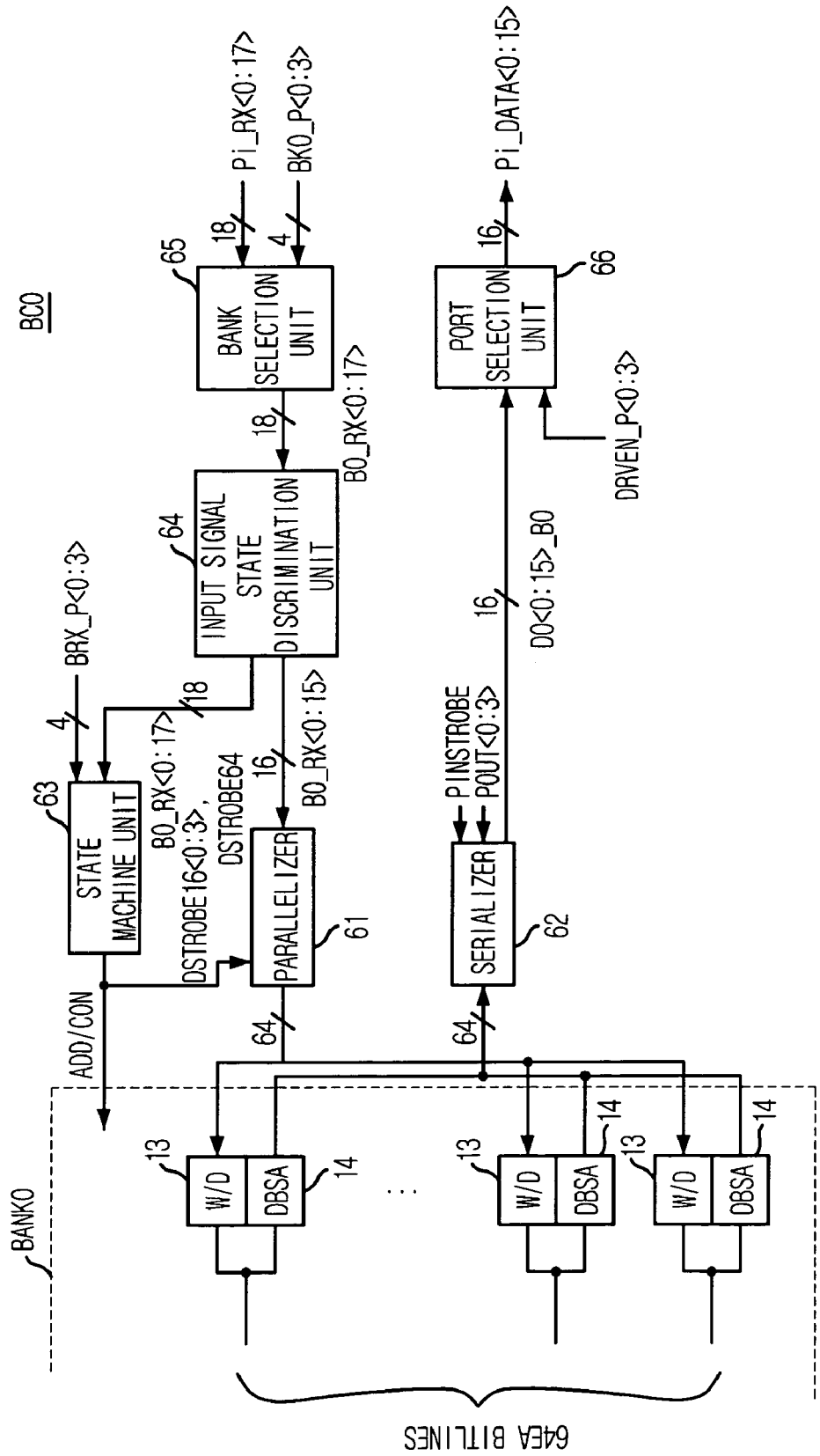
FIG. 6 is a circuit diagram of a first bank control unit shown in FIG. 2.

FIG. 6 is a circuit diagram of the first bank control unit BC0 shown in FIG. 2. Each of the first to eighth bank control units BC0 to BC7 is arranged for a corresponding one of the first to eighth banks BANK0 to BANK7 to thereby control transferring signals between the corresponding bank and each port PORT0 to PORT3. The bank control units BC1 to BC7 have the same structure with that of the first bank control unit BC0, and thus, the first bank control unit BC0 is explained as an example.

Referring to FIG. 6, the first bank control unit BC0 includes a parallelizer 61, a serializer 62, a state machine unit 63, an input signal state discrimination unit 64, a bank selection unit 65, and a port selection unit 66.

The bank selection unit 65 selects one signal group of a plurality of the 18-bit input valid data signal groups Pi_RX<0:17> outputted from each port in response to a 4-bit bank selection signal group BK0_P<0:3> and transfers it as a 18-bit bank valid data signal group B0_RX<0:17> to the first bank BANK0. Herein, the 4-bit bank selection signal group BK0_P<0:3> is part of the 8-bit port/bank selection signal group Pi_BK<0:7>. That is, the bank selection unit 65 receives 22-bit signals including the 4-bit bank selection signal group BK0—P<0:3> and the 18-bit input valid data signal group Pi_RX<0:17> from all ports through the second global I/O data bus GIO_IN to thereby output the 18-bit bank valid data signal group B0—RX<0:17> corresponding to the first bank BANK0.

A 16-bit signal group of the 18-bit bank valid data signal group B0_RX<0:17> is used as data, addresses or commands such as a bank mode determination signal, a 1-bit signal is used as an active flag signal, and a residuary 1-bit signal is used as a command flag signal for discriminating whether the 16-bit signal group is data signals or not. For instance, a seventeenth bank valid data signal B0_RX<16> of the 18-bit bank valid data signal group B0_RX<0:17> is used as the active flag signal and an eighteenth bank valid data signal B0_RX<17>, i.e., a most significant bit (MSB), is used as the command flag signal. Herein, the seventeenth bank valid data signal B0—RX<16> is used as the row address strobe/data mask (RAS/DM) signal, and the eighteenth bank valid data signal B0_RX<17> is used as an enable signal of the state machine unit 63. For reference, the RAS signal is an initial signal of the DRAM device as a chip enable signal for controlling an operation of the DRAM device.

The input signal state discrimination unit 64 receives the 18-bit bank valid data signal group B0_RX<0:17> and discriminates whether it is data, addresses or commands. In detail, the input signal state discrimination unit 64 discriminates whether the 16-bit signal group B0_RX<0:15> is data, addresses or commands based on status of the most significant bit (MSB) B0_RX<17>. When the 16-bit signal group B0_RX<0:15> is discriminated as data, the 16-bit signal group B0_RX<0:15> is transferred to the parallelizer 61. Otherwise, the 18-bit bank valid data signal group B0_RX<0:17> is transferred to the state machine unit 63.

The state machine unit 63 outputs an address/command signal ADD/CON based on the 18-bit bank valid data signal group B0_RX<0:17>. The address/command signal ADD/CON controls the operation of the DRAM device and includes internal command signals, internal address signals, and internal control signals. The internal command signals include an internal active signal ACT, an internal inactive state PCG, an internal read command signal READ, and an internal write command signal WRITE. The internal address signals include a row address XADD and a column address YADD. The internal control signals include an input data strobe signal such as DSTROBE16<0:3> and DSTROBE64, a driving enable signal group. DRVEN_P<0:3>, a pipe input strobe signal PINSTROBE, and a pipe output control signal group POUT<0:3>.

The parallelizer 61 converts the 16-bit signal group B0_RX<0:15> into 64-bit parallel output data and outputs it to the write driver (W/D) 13 of the corresponding bank. Herein, though the 16-bit signal group B0_RX<0:15> has a parallel form, it has to be converted into the 64-bit parallel output data because each memory cell of the banks performs a read or write operation with 64-bit data.

The serializer 62 converts 64-bit data signals outputted from the plurality of the DBSAs 14 into a 16-bit output data signal group D0<0:15>_B0 in response to the pipe input strobe signal PINSTROBE and the pipe output control signal group POUT<0:3>.

The port selection unit 66 sequentially receives the 16-bit output data signal group D0<0:15>—B0 outputted from the serializer 62 in units of 16-bit and outputs the valid data signal group Pi_DATA<0:15> to a corresponding port selected by decoding a 4-bit port selection signal group BRX_P<0:3>. Herein, the 4-bit port selection signal group BRX_P<0:3> is parts of the 8-bit port/bank selection signal group Pi_BK<0:7>.

Figure 7:
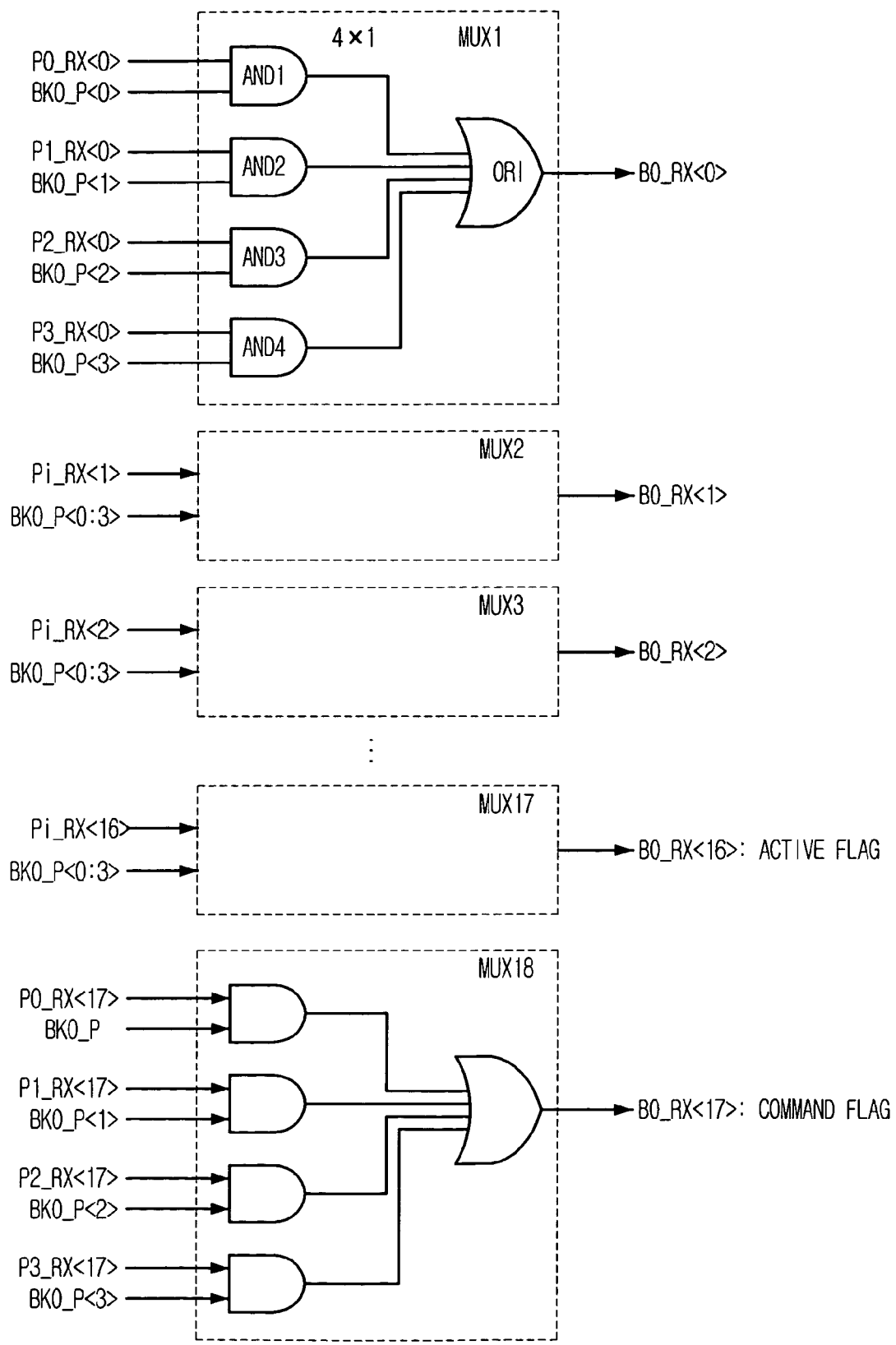
FIG. 7 is a circuit diagram of a bank selection unit shown in FIG. 6.

FIG. 7 is a circuit diagram of the bank selection unit 65 shown in FIG. 6.

The bank selection unit 65 includes eighteen multiplexers MUX1 to MUX18, each having a 4×1 structure, i.e., four input terminals and one output terminal. Each multiplexer includes four AND gates AND1 to AND4 and an OR gate OR1.

When the 4-bit bank selection signal group BK0_P<0:3> is activated with a logic level "HIGH", each multiplexer outputs a corresponding one of the 18-bit bank valid data signal group B0_RX<0:17> based on the 18-bit input valid data signal group Pi_RX<0:17> input from each port. For example, if a first bank selection signal BK0_P<0> inputted to the first multiplexer MUX1 is only activated with a logic level "HIGH", a first input valid data signal P0_RX<0> inputted from the first port PORT0, is only outputted as a first bank valid data signal B0_RX<0>.

Figure 8:
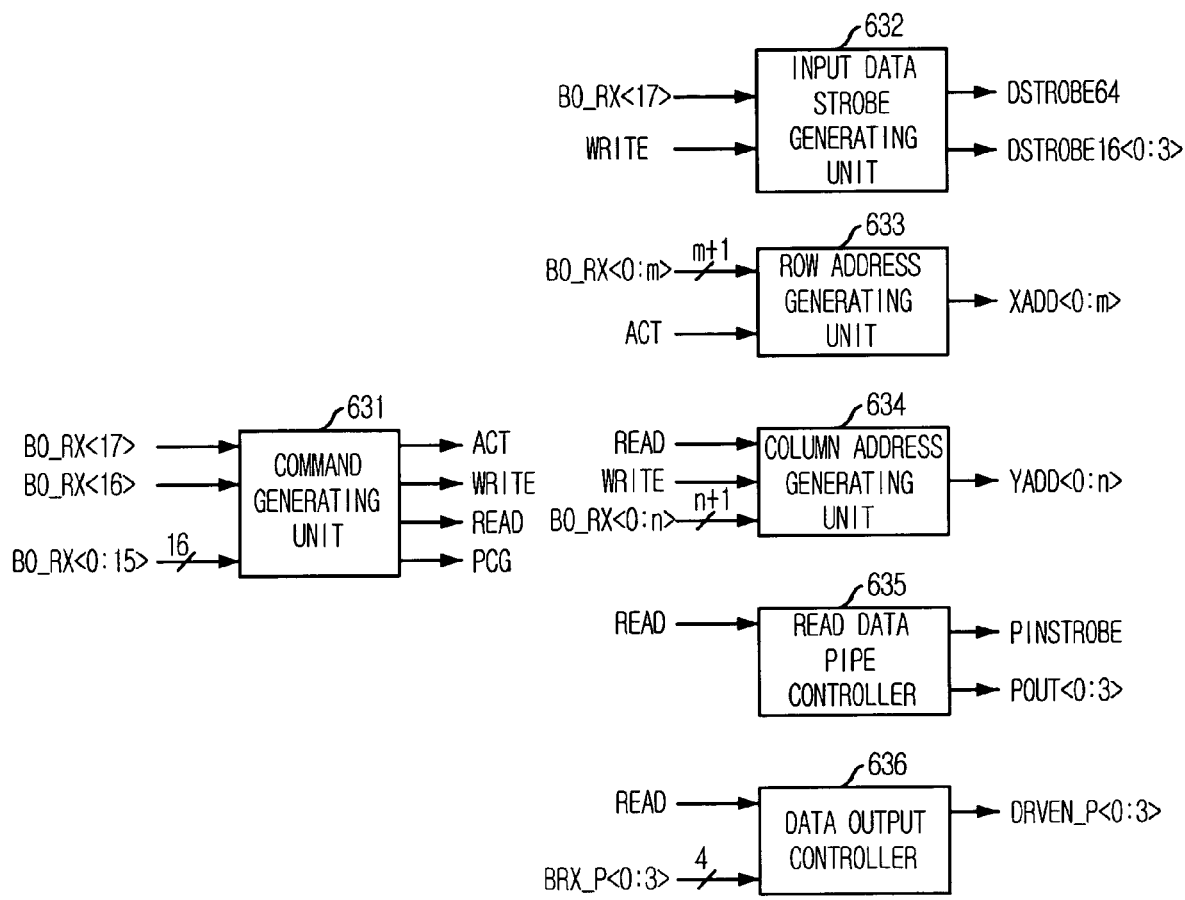
FIG. 8 is a circuit diagram of a state machine unit shown in FIG. 6.

FIG. 8 is a circuit diagram of the state machine unit 63 shown in FIG. 6.

The state machine unit 63 includes a command generating unit 631, an input data strobe generating unit 632, a row address generating unit 633, a column address generating unit 634, a read data pipe controller 635, and a data output controller 636.

The command generating unit 631 is enabled in response to two MSB bank valid data signals B0_RX<16:17>, and generates the internal command signals such as the internal active signal ACT, the internal inactive state PCG, the internal read command signal READ, and the internal write command signal WRITE by decoding the other 16-bit signal group B0_RX<0:15>. The command generating unit 631 includes a decoder for generating $2^n$ digital signals by receiving n digital signals, n being a positive integer.

The input data strobe generating unit 632 generates the input data strobe signal such as DSTROBE16<0:3> and DSTROBE64 in response to the eighteenth bank valid data signal B0_RX<17> and the internal write command signal WRITE. Herein, the input data strobe signal such as DSTROBE16<0:3> and DSTROBE64 are control signals for controlling an operation of the parallelizer 61.

The row address generating unit 633 receives the bank valid data signal group BRX<0:m> to generate a row address group XADD<0:m> in response to the internal active signal ACT, m being a positive integer.

The column address generating unit 634 receives the bank valid data signal group BRX<0:n> to generate a column address group YADD<0:n> in response to the internal read command signal READ and the internal write command signal WRITE, n being a positive integer.

The read data pipe controller 635 generates the pipe input strobe signal PINSTROBE and the pipe output control signal group POUT<0:3> in response to the internal read command signal READ.

The data output controller 636 receives the port selection signal group BRX_P<0:3> to generate the driving enable signal group DRVEN_P<0:3> in response to the internal read command signal READ. Herein, the driving enable signal group DRVEN_P<0:3> is a control signal for controlling an operation of the port selection unit 66.

Figure 9:
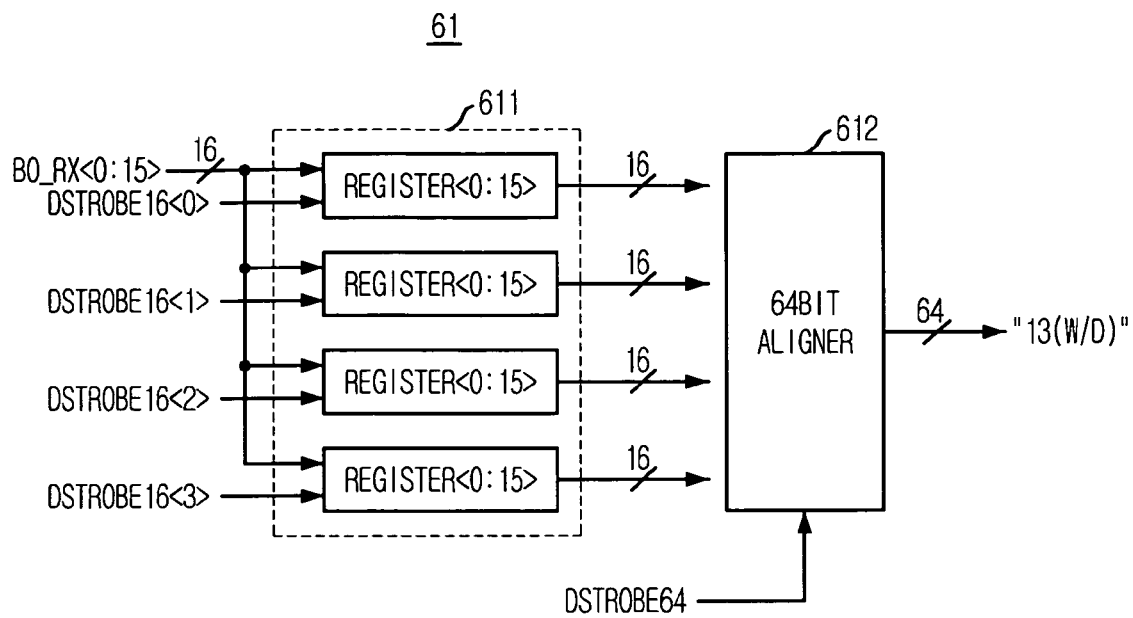
FIG. 9 is a circuit diagram of a parallelizer shown in FIG. 6.

FIG. 9 is a circuit diagram of the parallelizer 61 shown in FIG. 6.

The parallelizer 61 includes a storage unit 611 and an aligner 612.

The storage unit 611 includes a plurality of 16-bit registers, each for storing the 16-bit signal group B0_RX<0:15> inputted from the input signal state discrimination unit 64 in units of 16-bit in response to a corresponding one of the input data strobe signal DSTROBE16<0:3>. For example, the number of the registers is four to store 64-bit data signals.

The aligner 612 parallelizes the 64-bit data signals outputted from four registers in response to the input data strobe signal DSTROBE64.

Figure 10:
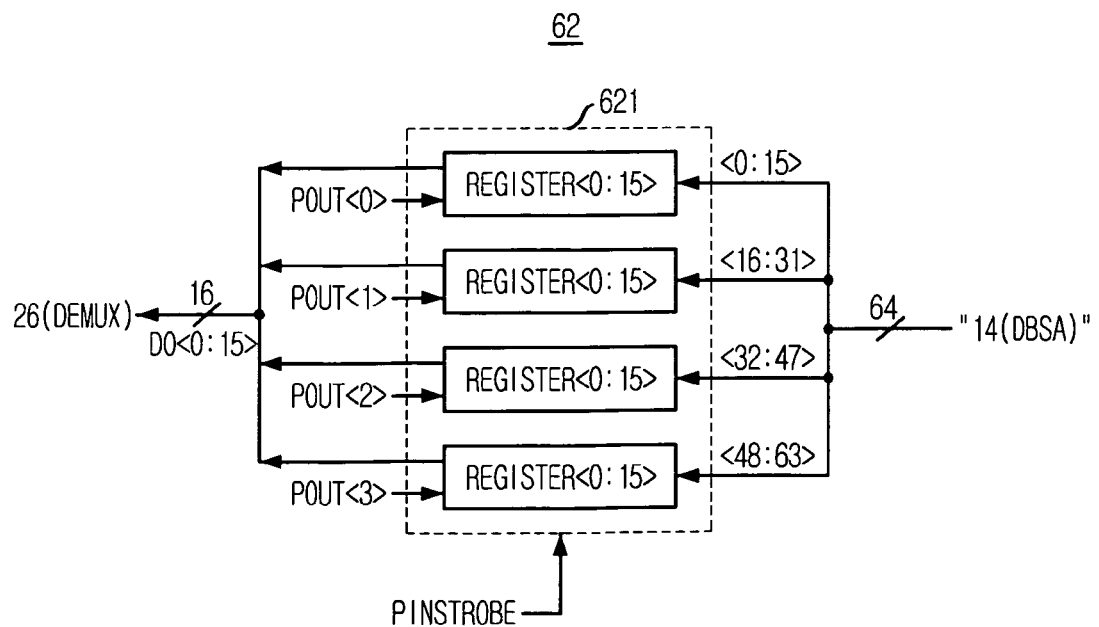
FIG. 10 is a circuit diagram of a serializer shown in FIG. 6.

FIG. 10 is a circuit diagram of the serializer 62 shown in FIG. 6.

The serializer 62 includes a storage unit 621 having four 16-bit registers for storing the 64-bit data signals outputted from the plurality of the DBSAs 14 in units of 16-bit in response to the pipe input strobe signal PINSTROBE.

Each register sequentially outputs the 16-bit output data signal group D0<0:15> to the port selection unit 66 in response to the pipe output control signal group POUT<0:3>.

Figure 11:
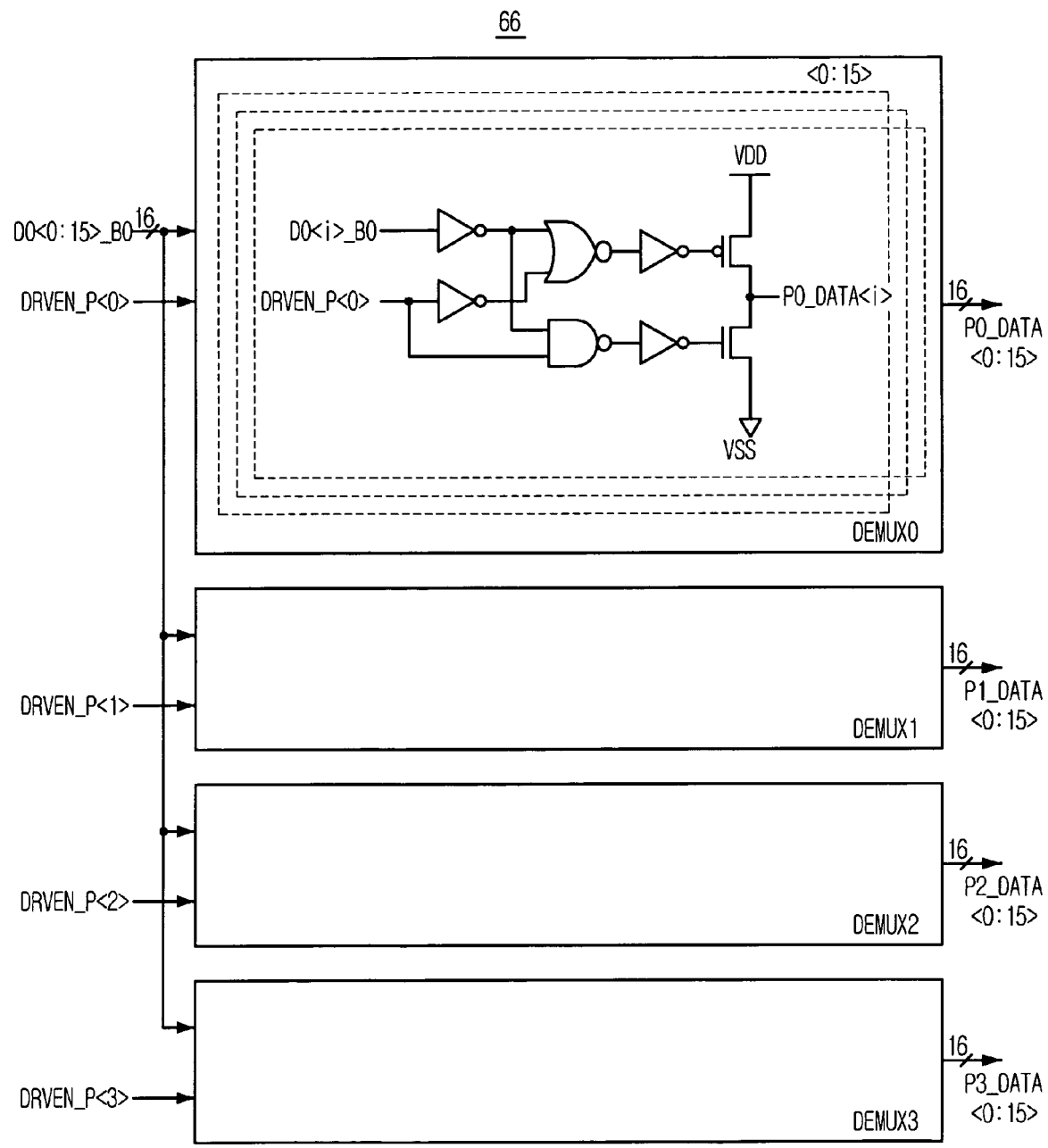
FIG. 11 is a block diagram of a port selection unit shown in FIG. 6.

FIG. 11 is a block diagram of the port selection unit 66 shown in FIG. 6.

The port selection unit 66 includes four demultiplexers DEMUX1 to DEMUX4. Each demultiplexer is allocated to each port so as to independently perform a signal transmission with all ports PORT0 to PORT3. Further, each demultiplexer includes sixteen drivers for processing the 16-bit output data signal group D0<0:15>.

Referring to FIG. 11, each driver may includes a tri-state buffer having first to fourth inverter INV1 to INV4, a NOR gate NOR1, a NAND gate NAND1, a pull-down transistor PM1, and a pull-up transistor NM1.

Accordingly, the port selection unit 66 receives the 16-bit output data signal group D0<0:15> and sequentially outputs the valid data signal group Pi_DATA<0:15> to a corresponding port in response to the driving enable signal group DRVEN—P<0:3>.

Hereinafter, referring to FIGS. 2 to 11, an operation of the multi-port memory device in accordance with the present invention will be explained in detail.

Figure 12:
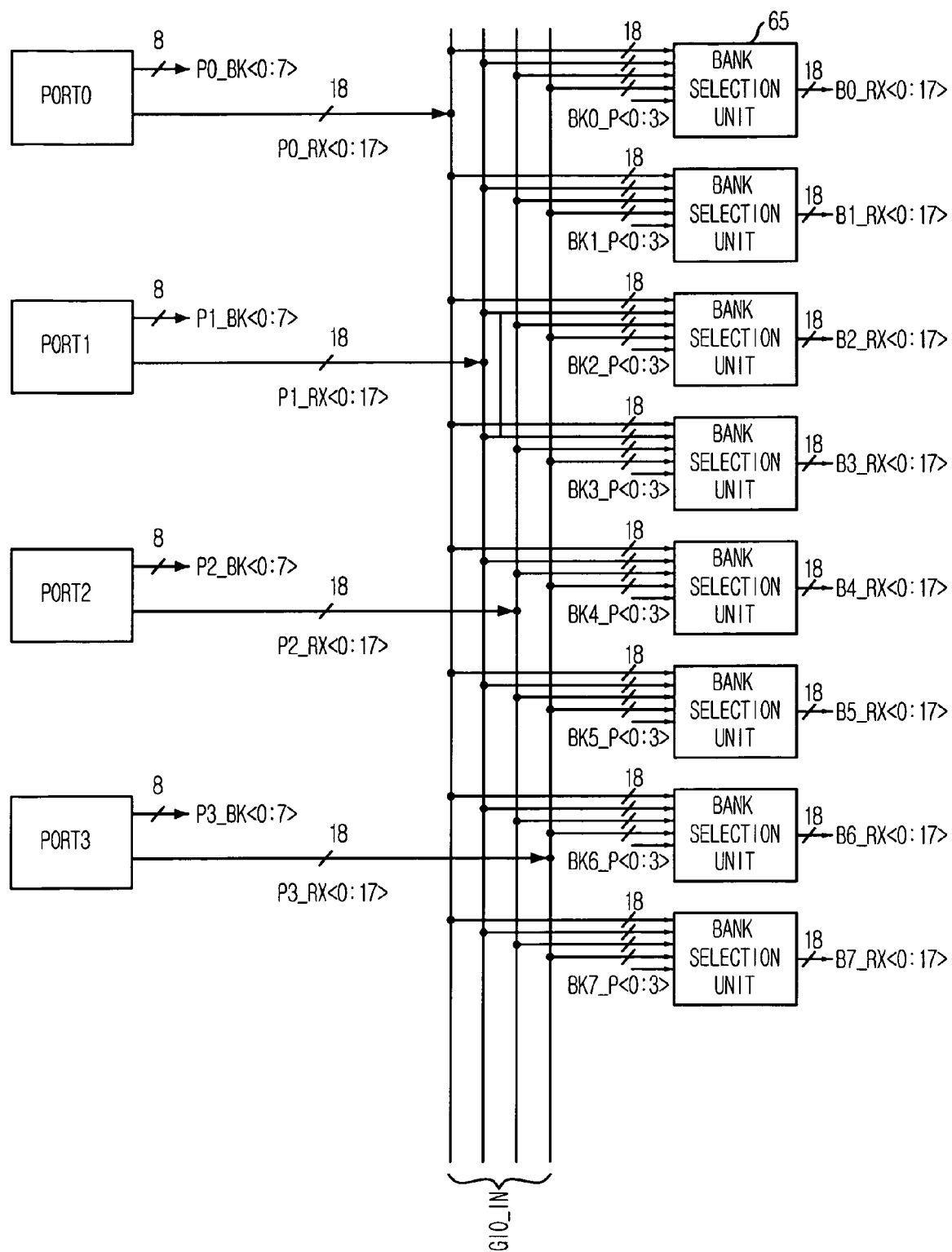
FIG. 12 is a signal diagram illustrating a signal input path from a port to a bank.
Figure 13:
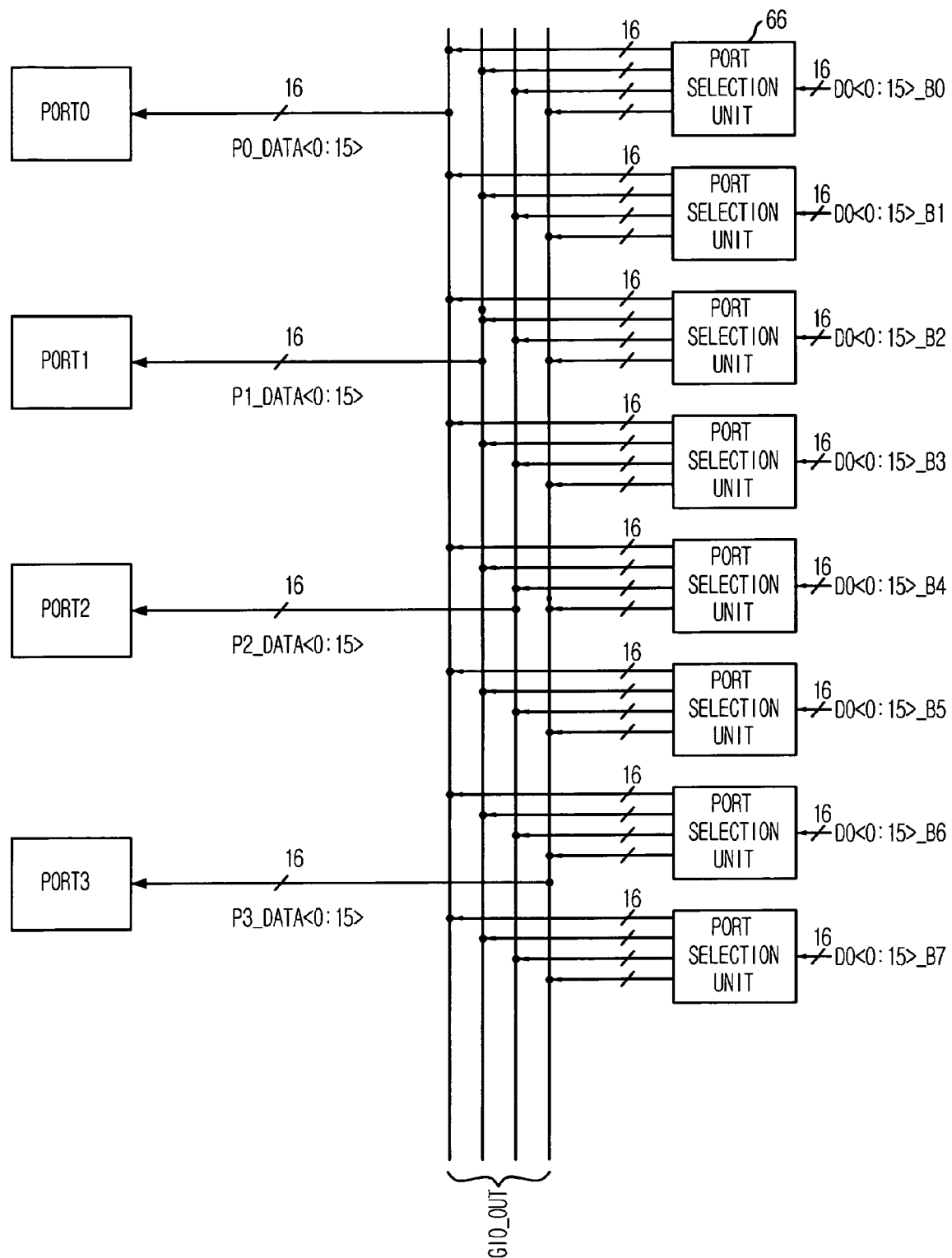
FIG. 13 is a signal diagram illustrating a signal output path from a bank to a port.

FIG. 12 is a signal diagram illustrating a signal input path from the ports to the banks, and FIG. 13 is a signal diagram illustrating a signal output path from the banks to the ports. Herein, the signal input path is related to the 8-bit port/bank selection signal group Pi_BK<0:7> and the 18-bit input valid data signal group Pi_RX<0:17>, and the signal output path is related to the valid data signal group Pi_data<0:15>.

First, the signal input path from the first port PORT0 to the second bank BANK1 is described.

Referring to FIG. 12, the 20-bit input signals are inputted from the external devices to each port through the reception pad RX in series. Each port converts the 20-bit input signals into the 26-bit valid signals including the 8-bit port/bank selection signal group Pi_BK<0:7> and the 18-bit input valid data signal group Pi_RX<0:17>, and outputs them to the second global I/O data bus GIO_IN. At this time, the second global I/O data bus GIO_IN is connected to the other banks, i.e., BANK0 and BANK2 to BANK7, as well as the second bank BANK1 through a second local I/O data bus LIO—BIN shown in FIG. 2. As a result, the 26-bit valid signals are transferred to the bank selection unit 65 of all bank control units BC0 to BC7 through the second local I/O data bus LIO—BIN.

In this time, because the 18-bit input valid data signal group P0_RX<0:17> output from the first port PORT0 is only transferred to the second bank BANK1, the 8-bit port/bank selection signal group P0_BK<0:7> is required to prevent the 18-bit input valid data signal group P0_RX<0:17> from being transferred to the other banks BANK0 and BANK2 to BANK7.

The bank selection unit 65 of the second bank control unit BC1 receives the 18-bit input valid data signal group P0_RX<0:17> in response to the 4-bit bank selection signal group BK1_P<0:3>, and transfers it as the 18-bit bank valid data signal group B1_RX<0:17> to the second bank BANK1. At this time, the other bank selection signal groups BK0_P<0:3> and BK2_P<0:3> to BK7_P<0:3> are inactivated so that the bank selection unit 65 of the other bank control units, i.e., BC0 and BC2 to BC7, does not operate. As a result, the 18-bit input valid data signal group P0_RX<0:17> is not transferred to the other banks BANK0 and BANK2 to BANK7.

Second, the signal output path from the second bank BANK1 to the first port PORT0 is described.

Referring to FIG. 13, the serializer 62 of the second bank control unit BC1 serializes the 64-bit data signals outputted from the second bank BANK1 and outputs the 16-bit output data signal group D0<0:15>_B1 to the demultiplexers of port selection unit 66.

The demultiplexers receives the 16-bit output data signal group D0<0:15>_B1 to output it as the 16-bit output valid data signal group P0_DATA<0:15> to the first global I/O data bus GIO_OUT in response to a first driving enable signal DRVEN—P<0> of the driving enable signal group DRVEN—P<0:3>.

The 16-bit output valid data signal group P0_DATA<0:15> loaded to the first global I/O data bus GIO_OUT is transferred to the first port PORT0 through a third local I/O data bus LIO_P1.

Third, a normal read operation of the multi-port memory device is explained. The normal read operation means to fetch data from a specific address of a corresponding bank.

If the read command frame form or the read data frame form shown in FIGS. 5D and 5E is inputted to the first port PORT0 through the reception port RX in series, the first port PORT0 parallelizes and converts the inputted signals into the 26-bit valid signals.

The 26-bit valid signals are inputted to the bank selection unit 65 of the second bank control unit BC1 through the second global I/O data bus GIO_IN. At this time, because the bank selection unit 65 is connected with the second global I/O data bus GIO_IN and the second local I/O data bus LIO_BIN shown in FIG. 2, the bank selection unit 65 of the second bank control unit BC1 receives the 26-bit valid signals from the other parts PORT1 to PORT3 as well as the first port PORT0.

Accordingly, the 2-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 actives the internal active signal ACT and the internal read command signal READ based on the 18-bit input valid data signal group P0_RX<0:17>. The row and column address generating units 633 and 634 of the state machine unit 63 generate the row and column addresses XADD and YADD of the second bank BANK1 based on the internal active signal ACT and the internal read command signal READ. The read data pipe controller 635 activates the pipe input strobe signal PINSTROBE and the pipe output control signal group POUT<0:3>, and the data output controller 636 activates the driving enable signal group DRVEN—P<0:3>.

The 64-bit data signals are amplified by the plurality of the DBSAs 14 of the second bank BANK1 and are outputted to the serializer 62 according to the column address YADD in response to the internal read command signal READ.

The serializer 62 serializes the 64-bit data signals outputted from the plurality of the DBSAs 14 to output the 16-bit output data signal group D0<0:15>_B1 in response to the pipe input strobe signal PINSTROBE and the pipe output control signal group POUT<0:3>. That is, the serializer 62 converts the 64-bit data signals into the 16-bit output data signal group D0<0:15>_B1 in units of four, and sequentially outputs the 16-bit output data signal group D0<0:15>_B1 to the port selection unit 66.

The port selection unit 66 receives the 16-bit output data signal group D0<0:15>_B1 and outputs the valid data signal group Pi_DATA<0:15> to the first port PORT0 through the first global I/O data bus GIO_OUT in units of 16-bit based on the driving enable signal group DRVEN—P<0:3> which is generated by decoding the 4-bit port selection signal group BRX—P<0:3>.

Referring to FIG. 4, the first port PORT0 serializes and outputs the valid data signal group Pi_DATA<0:15> to the external devices through the transmission pad TX.

Fourth, a normal write operation of the multi-port memory device is explained. The normal write operation means to write data to a specific address of a corresponding bank. In accordance with the embodiment of the present invention, input signals having five frame forms are inputted through the reception pad RX during the normal write operation. A first frame is a command frame shown in FIG. 5B, and the other frames are data frames shown in FIG. 5C. Each frame includes 16-bit data, and thus, a total frame includes 64-bit data.

The command and data frame forms are consecutively inputted to the first port PORT0, the parallelizer 411 of the first port PORT0 parallelizes and converts each frame form into the 26-bit valid signals.

The bank selection unit 65 of the second bank control unit BC1 receives the 26-bit valid signals inputted from the first port PORT0 through the second global I/O data bus second global I/O data bus GIO_IN. At this time, because the bank selection unit 65 of the second bank control unit BC1 is connected with the second global I/O data bus GIO_IN and the second local I/O data bus LIO—BIN shown in FIG. 2, the bank selection unit 65 of the second bank control unit BC1 receives the 26-bit valid signals from the other ports PORT1 to PORT3 as well as the first port PORT0.

Accordingly, the 26-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 activates the internal active signal ACT and the internal write command signal WRIRE based on the 18-bit input valid data signal group P0_RX<0:17>. The row and column address generating units 633 and 634 of the state machine unit 63 generate the row and column addresses XADD and YADD of the second bank BANK1, and the input data strobe generating unit 632 generates the input data strobe signals DSTROBE16<0:3> and DSTROBE64 in response to the eighteenth bank valid data signal BRX<17>, the internal active signal ACT and the internal write command signal WRITE.

Then, after the other data frames are consecutively inputted, the parallelizer 61 of the second bank control unit BC1 converts the 16-bit signal group B1—RX<0:15> relating to the 18-bit input valid data signal group P0_RX<0:17> into the 64-bit parallel output data. The write driver (W/D) 13 of the second bank BANK1 writes the 64-bit parallel output data to the memory cell array 10.

During the normal write operation, if four frames including a data frame are consecutively inputted, 64 data bits are written to the memory cell array at the same time. However, before all of the four frames are inputted, another command can be performed by an interrupt. At this time, data inputted before the interrupt is performed are only written to the memory cell array.

While the present invention has been described with respect to certain preferred embodiments, i.e., the multi-port memory device including four ports, eight banks and a 16-bit data frame structure, and performing a 64-bit prefetch operation, it will be apparent to those skilled in the art that various changes and modifications may be made without departing from the spirit and scope of the invention as defined in the following claims. That is, if the multi-port memory device includes 'j' ports, 'k' banks and an 'm'-bit data frame structure and performs an 'n'-bit prefetch operation, the number of global I/O data buses may be adjusted accordingly. In detail, the global I/O data buses for transferring signals from ports to banks include 'k' buses for transferring port/bank selection signals, 'm' buses for transferring command/address/data signals, 'a' buses for transferring command flag signals and RAS/DM signals per one port. In addition, the global I/O data buses for transferring signals from banks to ports include 'm' buses. Accordingly, it is possible to compose the multi-port memory device by adjusting the numbers of ports, banks, data frames and prefetches. Herein, 'i', 'j', 'k', 'm', 'n' and 'a' are positive integers.

As described above, in accordance with the present invention, the multi-port memory device can be linked with a plurality of multimedia devices and be easy to allocate a large amount of memory to a specific multimedia device having a higher ratio of memory utilization, thereby raising an efficiency of memory utilization.

Also, during data is outputted from one port, data can be inputted to another port by separating global I/O data buses into an input bus GIO_IN and an output bus GIO_OUT. Accordingly, it is possible to raise an efficiency of memory operation for equal time.

In accordance with the present invention, the multi-port memory device performs read and write operations by converting a 16-bit serial data signal inputted from each bank into a 64-bit parallel data signal, thereby enlarging a data input/output (I/O) width transferred for one memory access.

Further, each bank includes a unique bank control unit, and thus, input signals can be classified into data signals, command signals and address signals by the unique bank control unit. Accordingly, there is no need to divide a frame into data bits, command bits and address bits per one port, thereby effectively using the frame. As a result, it is possible to provide addressing of high density and a large data I/O width in despite of a small frame.

The present application contains subject matter related to Korean patent application Nos. 2005-90936 & 2006-32948, filed in the Korean Intellectual Property Office on Sep. 29, 2005 and Apr. 11, 2006, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A multi-port memory device, comprising:
    a plurality of ports located at a center region of the multi-port memory device, each for performing a data communication with a corresponding external device;

a plurality of banks arranged at upper and lower regions of the multi-port memory device, each bank for coupling to a corresponding one of said ports;

first and second global I/O data buses disposed between the banks and the ports, each for independently performing a data transmission between the banks and the ports; and a plurality of bank control units, each of the bank control units allocated to a corresponding one of the banks and controlling the data transmission between the corresponding bank and the ports, wherein each of the bank control units receives a bank selection signal and an input valid data signal from each of the ports and determines whether the input valid data signal belongs to the corresponding bank based on the bank selection signal to transfer the input valid data signal to the corresponding bank, and transfers an output valid data signal outputted from the corresponding bank to a corresponding one of the ports selected based on the bank selection signal.

2. The multi-port memory device as recited in claim 1, wherein each of the bank control units performs the data transmission with the corresponding bank and the ports in parallel.

3. The multi-port memory device as recited in claim 1, wherein each of the bank control units parallelizes the input valid data signal with the bit number of data lines of the corresponding bank, and transfers the parallelized signal to the corresponding bank.

4. The multi-port memory device as recited in claim 3, wherein each of the bank control units transfers the output valid data signal to the corresponding port in units of the bit number of data lines of the first and second global I/O data buses.

5. The multi-port memory device as recited in claim 2, wherein each of the bank control units includes:
   a bank selection unit for receiving bank selection signal groups and input valid data signal groups from the ports, selecting a corresponding one of the input valid data signal groups by decoding the bank selection signal groups, and outputting a bank valid data signal group;
   an input signal state discrimination unit for discriminating a status of the bank valid data signal group;
   a state machine unit for generating addresses, command signals and control signals of the corresponding bank based on the status of the bank valid data signal group;
   a parallelizer for converting the bank valid data signal group with the bit number of data lines of the corresponding bank in response to the control signals outputted from the state machine unit;
   a serializer for converting an output valid data signal outputted from the corresponding bank with the bit number of data lines of the first and second global I/O data buses in response to the control signals outputted from the state machine unit; and
   a port selection unit for outputting the output valid data signal from the serializer to a corresponding port selected by the control signals outputted from the state machine unit based on the bank selection signal groups.

6. The multi-port memory device as recited in claim 5, wherein the bank selection unit includes a plurality of multiplexers corresponding to the bit number of the input valid data signal group.

7. The multi-port memory device as recited in claim 6, wherein each multiplexer includes four inputs and one output.

8. The multi-port memory device as recited in claim 5, wherein the input signal state discrimination unit discriminates whether the bank valid data signal group except for a most significant bit (MSB) is data, addresses or commands based on the MSB of the bank valid data signal group; and transfers the bank valid data signal group except for the MSB to the parallelizer if the bank valid data signal group except for the MSB is data, and otherwise, transfers the bank valid data signal group to the state machine unit.

9. The multi-port memory device as recited in claim 8, wherein the state machine unit includes:
   a command generating unit, enabled in response to the MSB of the bank valid data signal group, for generating the command signals by decoding the bank valid data signal group except for the MSB;
   an input data strobe generating unit for generating first and second input data strobe signals in response to a write signal of the command signals;
   a row address generating unit for outputting the bank valid data signal group as a row address group of the corresponding bank in response to an internal active signal of the command signals;
   a column address generating unit for outputting the bank valid data signal group as a column address group of the corresponding bank in response to the write signal and a read signal of the command signals;
   a read data pipe controller for generating first and second pipe strobe signals in response to the read signal; and
   a data output controller for generating a driving enable signal in response to the read signal and the bank selection signal group.

10. The multi-port memory device as recited in claim 9, wherein the first and second input data strobe signals control the parallelizer; the first and second pipe strobe signals control the serializer; and the driving enable signal controls the port selection unit.

11. The multi-port memory device as recited in claim 10, wherein the command generating unit includes a decoder for generating $2^n$ digital signals by receiving n digital signals, n being a positive integer.

12. The multi-port memory device as recited in claim 10, wherein the parallelizer includes:
   a storage unit including a plurality of registers, each register for storing the bank valid data signal group outputted from the input signal state discrimination unit in response to the first input data strobe signal; and
   an aligner for aligning signals sequentially outputted from the registers in response to the second input data strobe signal.

13. The multi-port memory device as recited in claim 10, wherein the serializer serializes signals outputted from a plurality of data bus sense amplifiers (DBSAs) of the corresponding bank in response to the first and second pipe strobe signals.

14. The multi-port memory device as recited in claim 13, wherein the serializer includes a storage unit having a plurality of registers for storing the signals outputted from the plurality of DBSAs in response to the first and second pipe strobe signals.

15. The multi-port memory device as recited in claim 10, wherein the port selection unit includes a plurality of demultiplexers corresponding to the bit number of the output valid data signal.

16. The multi-port memory device as recited in claim 15, wherein each demultiplexer is allocated to a corresponding one of the ports so as to independently perform the signal transmission with each of the ports.

17. The multi-port memory device as recited in claim 16, wherein each demultiplexer includes a plurality of drivers, each driver being a tri-state buffer.

18. The multi-port memory device as recited in claim 1, wherein each port is connected to the first and second global I/O data buses so as to independently access a corresponding one of the banks.

19. The multi-port memory device as recited in claim 18, wherein each port performs a parallel data communication with the corresponding bank through the first and second global I/O data buses, and performs a serial data communication with the corresponding external device.

20. The multi-port memory device as recited in claim 19, wherein each port includes:
   a reception unit for receiving input signals inputted from the corresponding external device through a reception pad; and
   a transmission unit for outputting output signals provided from the banks through a transmission pad,
   wherein the reception unit and the transmission unit operate independently so that the input signals and the output signals are simultaneously transferred.

21. The multi-port memory device as recited in claim 20, wherein the reception unit parallelizes the input signals inputted in series from the corresponding external device through the reception pad to output an input valid data signal group and a bank selection signal group.

22. The multi-port memory device as recited in claim 20, wherein the reception unit includes:
   a parallelizer for parallelizing the input signals inputted from the corresponding external device and outputting the parallelized input signals;
   a command generating unit for receiving the parallelized input signals and outputting a bank information signal;
   a bank address generating unit for outputting a bank address for selecting the corresponding bank based on the bank information signal;
   a bank address output unit for outputting the bank selection signal group to the first global I/O data bus based on the bank address; and
   an input valid data output unit for outputting the input valid data signal group to the first global I/O data bus based on the parallelized input signals.

23. The multi-port memory device as recited in claim 22, wherein the bank address generating unit includes a decoder.

24. The multi-port memory device as recited in claim 22, wherein the bank address output unit includes a plurality of output drivers.

25. The multi-port memory device as recited in claim 22, wherein the input valid data output unit includes a plurality of output drivers.

26. The multi-port memory device as recited in claim 20, wherein the transmission unit serializes the output signals inputted in parallel from the banks through the second global I/O data bus, and outputs the serialized output signals through the transmission pad.

27. The multi-port memory device as recited in claim 26, wherein the transmission unit includes:
   an output valid data input unit for receiving the output signals to packet them as a transfer protocol; and
   a serializer for serializing output signals from the output valid data input unit, and outputting the serialized signals to the transmission pad.

28. The multi-port memory device as recited in claim 18, wherein the first and second global I/O data buses perform a parallel data transmission between the ports and the banks.

29. The multi-port memory device as recited in claim 28, wherein the first global I/O data bus transmits the input valid data signal inputted from the ports to the banks in parallel.

30. The multi-port memory device as recited in claim 29, wherein the first global I/O data bus is located between the ports and lower banks arranged at the lower regions of the multi-port memory device.

31. The multi-port memory device as recited in claim 28, wherein the second global I/O data bus transmits an output valid data signal inputted from the banks to the ports in parallel.

32. The multi-port memory device as recited in claim 31, wherein the second global I/O data bus is located between the ports and upper banks arranged at the upper regions of the multi-port memory device.

33. The multi-port memory device as recited in claim 1, further comprising first and second local I/O data buses for performing a data transmission between the first and second global I/O data buses and the ports, and a data transmission between the first and second global I/O data buses and the banks.

34. A multi-port memory device, comprising:
   a plurality of ports located at a center region of the multi-port memory device, each for performing a serial data communication with a corresponding external device;
   a plurality of banks, arranged at upper and lower regions of the multi-port memory device in a row direction on the basis of the plurality of ports, for performing a parallel data communication with the plurality of ports;
   a plurality of bank control units, each bank control unit allocated to a corresponding one of the banks and controlling the data transmission between the corresponding bank and the ports,
   wherein each port includes:
   a reception unit for receiving input signals inputted in series from the corresponding external device through a reception pad to output an input valid data signal group and a bank selection signal group; and
   a transmission unit for serializing output signals outputted in parallel from the banks and outputting the serialized output signals through a transmission pad.

35. The multi-port memory device as recited in claim 34, wherein the reception unit and the transmission unit operate independently so that the input signals and the output signals are simultaneously transferred.

36. The multi-port memory device as recited in claim 35, wherein the reception unit includes:
   a parallelizer for parallelizing the input signals inputted from the corresponding external device and outputting the parallelized input signals;
   a command generating unit for receiving the parallelized input signals and outputting a bank information signal;
   a bank address generating unit for outputting a bank address for selecting the corresponding bank based on the bank information signal;
   a bank address output unit for outputting the bank selection signal group to the bank control units based on the bank address; and
   an input valid data output unit for outputting the input valid data signal group to the bank control units based on the parallelized input signals.

37. The multi-port memory device as recited in claim 36, wherein the transmission unit includes:
   an output valid data input unit for receiving the output signals to packet them for a transfer protocol; and a serializer for serializing output signals from the output valid data input unit, and outputting the serialized signals to the transmission pad.

38. The multi-port memory device as recited in claim 35, wherein each bank control unit includes:

a bank selection unit for receiving the bank selection signal groups and the input valid data signal groups from the ports, selecting a corresponding one of the input valid data signal groups by decoding the bank selection signal groups, and outputting a bank valid data signal group;

an input signal state discrimination unit for discriminating a status of the bank valid data signal group;

a state machine unit for generating addresses, command signals and control signals of the corresponding bank based on the status of the bank valid data signal group;

a parallelizer for parallelizing the bank valid data signal group with the bit number of data lines of the corresponding bank in response to the control signals outputted from the state machine unit;

a serializer for serializing an output valid data signal outputted from the corresponding bank with the bit number of data lines of the first and second global I/O data buses in response to the control signals outputted from the state machine unit; and a port selection unit for outputting the output valid data signal outputted from the serializer to a corresponding port selected by the control signals outputted from the state machine unit based on the bank selection signal groups.

39. The multi-port memory device as recited in claim 38, wherein the state machine unit includes:

a command generating unit, enabled in response to a most significant bit (MSB) of the bank valid data signal group, for generating the command signals by decoding the bank valid data signal group except for the MSB;

an input data strobe generating unit for generating first and second input data strobe signals in response to a write signal of the command signals;

a row address generating unit for outputting the bank valid data signal group as a row address group of the corresponding bank in response to an internal active signal of the command signals;

a column address generating unit for outputting the bank valid data signal group as a column address group of the corresponding bank in response to the write signal and a read signal of the command signals;

a read data pipe controller for generating first and second pipe strobe signals in response to the read signal; and a data output controller for generating a driving enable signal in response to the read signal and the bank selection signal group.

40. The multi-port memory device as recited in claim 39, wherein the first and second input data strobe signals control the parallelizer; the first and second pipe strobe signals control the serializer; and the driving enable signal controls the port selection unit.

41. The multi-port memory device as recited in claim 40, wherein the parallelizer includes:

a storage unit including a plurality of registers, each register for storing the bank valid data signal group outputted from the input signal state discrimination unit in response to the first input data strobe signal; and an aligner for aligning signals sequentially outputted from the registers in response to the second input data strobe signal.

42. The multi-port memory device as recited in claim 40, wherein the serializer includes a storage unit having a plurality of registers for storing signals outputted from a plurality of data bus sense amplifiers of the corresponding bank in response to the first and second pipe strobe signals.

43. The multi-port memory device as recited in claim 40, wherein the port selection unit includes a plurality of demultiplexers corresponding to the bit number of the output valid data signal.

* * * * *